United States Patent [19]
Marieb et al.

[11] Patent Number: 5,909,635
[45] Date of Patent: Jun. 1, 1999

[54] CLADDING OF AN INTERCONNECT FOR IMPROVED ELECTROMIGRATION PERFORMANCE

[75] Inventors: Thomas Marieb, San Francisco; Donald Gardner, Mountain View; Quat Vu, Santa Clara, all of Calif.

[73] Assignee: Intel Corporation, Santa Clara, Calif.

[21] Appl. No.: 08/673,277

[22] Filed: Jun. 28, 1996

[51] Int. Cl.$^6$ .................................................. H01L 21/441
[52] U.S. Cl. .......................... 438/625; 438/644; 438/648; 438/688
[58] Field of Search ..................................... 438/625, 627, 438/644, 648, 687, 688

[56] References Cited

U.S. PATENT DOCUMENTS

| | | |
|---|---|---|
| 4,742,014 | 5/1988 | Hooper et al. . |
| 4,963,510 | 10/1990 | Roane . |
| 5,164,332 | 11/1992 | Kumar . |
| 5,332,693 | 7/1994 | Kim . |

OTHER PUBLICATIONS

Donald S. Gardner, et al. "Encapsulated Copper Interconnection Device" 1991 Proc. 8th Int. IEEE VLSI Multilevel Interconnection Conf. (Jun. 1991). pp. 99–108.

*Primary Examiner*—Caridad Everhart
*Attorney, Agent, or Firm*—Blakely, Sokoloff, Taylor & Zafman

[57] ABSTRACT

According to one embodiment, a method for encapsulating a conductive structure having a first layer, a second layer and a third layer, with a cladding layer, for improved electromigration performance is described. The method comprises the following steps: forming a fourth layer over the conductive structure and reacting at least a portion of the first layer, the third layer and the fourth layer with a portion of the second layer to form a cladding layer that encapsulates an unreacted portion of the second layer. In one embodiment of the present invention, the cladding layer is TiAl$_3$.

38 Claims, 2 Drawing Sheets

CLADDING OF AN INTERCONNECT FOR IMPROVED ELECTROMIGRATION PERFORMANCE

BACKGROUND OF THE INVENTION

1. Field of the Invention

The field of our invention relates generally to semiconductor manufacturing, and more particularly to a method for cladding an interconnect for improved electromigration performance.

2. Description of Related Art

During the process of semiconductor fabrication, metal films are deposited on a wafer surface. After being patterned into various metal strips or lines utilizing, for example, a photomasking process, a metal layer then connects the devices on the wafer as required by the circuit operation. These strips of metal are often referred to as interconnects.

Interconnects are impacted as the semiconductor industry moves toward smaller and smaller device dimensions in order to allow for a greater density of devices per wafer. As the device dimensions shrink, the width of the interconnects also shrinks. Therefore, the narrow dimensions of an electrical interconnect lead to higher resistances and greater current densities in the conductive layer which forms the electrical interconnect. The increased current density then causes a reduction in the electromigration lifetime.

Electromigration is a phenomenon that occurs in aluminum interconnects while the circuit is in operation. Electromigration shows up as a field failure, and not as a failure during semiconductor processing. Electromigration is caused by the diffusion of the aluminum atoms in electrical fields set up in the interconnect while the circuit is in operation. Electromigration is often the result of the movement of the electrons in a conductor when an electrical field is raised to a very high level and the operating temperature is high. This results in a physical displacement of conductor atoms, such as aluminum atoms, that eventually leads to an open conductor and circuit failure when the metal thins and eventually separates completely. Electromigration becomes even more of a problem as the level of integration increases. This is because the higher number of components in a VLSI (Very Large Scale Integration) circuit creates more current flow and also generates more heat.

One solution to increasing the electromigration lifetime of an aluminum interconnect is to introduce an alloying species, for example, typically 0.5% copper to the aluminum. Another solution is to deposit a thin layer of a metal (or metals) prior to the deposition of the aluminum. This thin layer of metal, usually titanium, acts as a barrier or shunt layer. Therefore, if there is a small void in an aluminum interconnect, the current may go around the void by going down through the barrier layer instead. The result is a longer electromigration lifetime because it requires greater damage to the aluminum interconnect or line with the barrier layer in order to cause the same amount of damage to the electrical circuit without the barrier layer.

This solution, however, has several drawbacks. First, titanium has a much higher resistance than aluminum. Second, current barrier layers do not prevent hillocking at the sidewalls of an interconnect, so their effectiveness as a constraint is limited. A hillock is the localized displacement of a thin film material, such as aluminum, that occurs when the material is heated and cooled or when the material has undergone electromigration stressing. A hillock provides a location to accumulate the material that has been displaced when a void is created. Ease of hillocking is associated with degraded electromigration performance.

Another solution is to apply a mechanical constraint to the aluminum line or interconnect by passivation. This constraint is usually a layer of silicon dioxide deposited around the line which also electrically isolates one line from another. However, the industry is moving away from silicon dioxide and toward low temperature polymers as insulation/passivation layers in an effort to increase performance. This is because the use of the polymers as passivation layers has been ground to decrease the time delay of circuits. Unfortunately, these polymers are softer than silicon dioxide and thus, are unable to act as an effective mechanical constraint against electromigration induced hillocking.

Thus, what is needed is a process for cladding an interconnect to increase electromigration lifetime, prevent or reduce sidewall hillocking and allow the use of soft polymers to lower the RC (resistance-capacitance) time delay of a circuit.

SUMMARY

One embodiment of the present invention describes a method for encapsulating a conductive structure. The method comprises forming a layer over said conductive structure, wherein said layer encapsulates said conductive structure to provide a mechanical constraint.

BRIEF DESCRIPTION OF THE DRAWINGS

The present invention is illustrated by way of example and not by limitation in the figures of the accompanying drawings in which like references indicate similar elements.

DETAILED DESCRIPTION

A method is described for encapsulating a conductive structure, such as an interconnect, on a semiconductor substrate, for improved electromigration performance. In the following description, numerous specific details are given to provide a thorough understanding of the invention, such as the use of titanium as a barrier layer or the use of an aluminum alloy. However, it will still be apparent to one skilled in the art that the invention may be practiced without these specific details. Moreover, in some instances, well-known semiconductor equipment and processes have not been set forth in detail in order not to unnecessarily obscure the present invention.

Figure 1A:
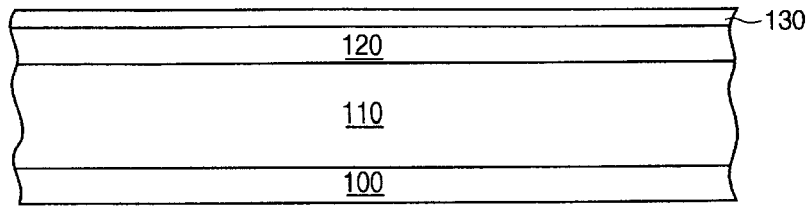
FIG. 1A illustrates the formation of four layers of a conductive structure in a preferred embodiment of the present inventive method.
Figure 1B:
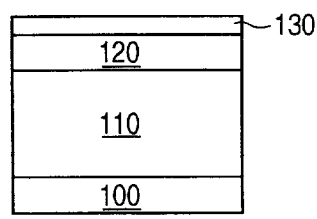
FIG. 1B illustrates a conductive structure that results from an etch of the four layers of FIG. 1A.

FIGS. 1A–1E illustrate a preferred embodiment of the method of the present invention. In FIG. 1A, a barrier layer of titanium 100 is sputtered deposited, such that the titanium 100 has a thickness of about 0.1 micron ($\mu$m) to 0.4 $\mu$m. Next, an aluminum alloy 110 composed of aluminum (Al) with 0.5% copper (Cu) is sputtered deposited over titanium layer 100. The Al-0.5% Cu layer 110 has a thickness of approximately 0.3 $\mu$m to 2 $\mu$m. Next, a second layer of titanium 120 of approximately 0.1 $\mu$m to 0.4 $\mu$m is sputtered deposited. Finally, a layer of titanium nitride (TiN) 130 with a thickness of about 0.05 $\mu$m is sputter deposited. The TiN layer 130 acts as a type of reaction stop layer since the TiN will not react with the Al-0.5% Cu to form titanium trialuminum (TiAl$_3$). In addition, the TiN layer 130 also acts as an anti-reflective coating to make lithography of the interconnect easier since the TiN 130 does not reflect as much as the TiAl$_3$. A conventional dry etch is then used to etch through titanium layer 100, Al-0.5% Cu layer 110, titanium layer 120 and TiN layer 130 to form a conductive structure, such as an interconnect, as shown in FIG. 1B.

Referring to FIG. 3, a third titanium layer 140 is then sputtered deposited over the conductive structure of FIG. 1B. The amount of titanium 140 deposited will depend on how much of a reaction one desires between the titanium layer 140 and the Al-0.5% Cu layer 110. Heat, in the range of approximately 350 degrees Celsius (C°)–450° C. is applied to accelerate the chemical reaction between the aluminum and the titanium. The chemical reaction is 3Al→TiAl$_3$. The application of heat simply accelerates the chemical reaction. The results of the chemical reaction are illustrated in FIG. 1D. TiAl$_3$ layer 150 now encapsulates a reduced volume of Al-0.5% Cu 110. Although all of the titanium layers (100, 120) are shown as being consumed by the chemical reaction with aluminum in FIG. 1D, one may deposit a thicker layer of titanium (either 100 or 120) in order to avoid total consumption of the titanium during the reaction. As expected, TiN layer 130 remains unchanged as it does not react with the aluminum to form TiAl$_3$.

All of the sidewalls of titanium layer 140 are consumed in order to form the cladding layer of TiAl$_3$ 150. An unreacted portion of Al-0.5% Cu 110 is now encapsulated by a cladding layer of TiAl$_3$ 150. This should help prevent hillocking at the sidewalls since the Al-0.5% Cu 110 is completely surrounded as opposed to the prior art where the sidewalls were exposed.

Figure 1C:
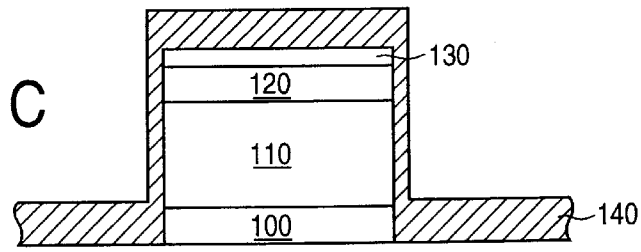
FIG. 1C illustrates formation of a fifth layer over the conductive structure.
Figure 1D:
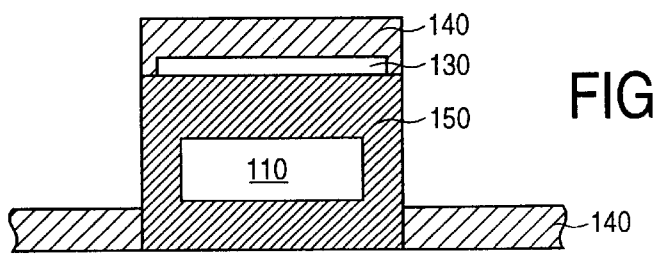
FIG. 1D illustrates an encapsulated line after formation of a cladding layer.
Figure 1E:
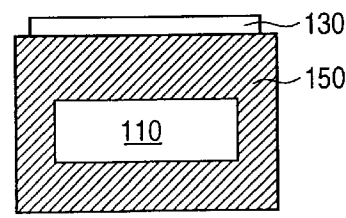
FIG. 1E illustrates a final structure after completion of a preferred method of the present invention.

The final step of the preferred embodiment is etching any unreacted portions of titanium layer 140, as shown in FIG. 1E. The result is an Al-0.5% Cu line or interconnect encapsulated in a stiff intermetallic, such as TiAl$_3$ 150, and capped by a thin layer of TiN 130. As the industry moves toward using polymers and other softer materials as an insulation/passivation layer (instead of silicon dioxide), the use of a stiff intermetallic, such as TiAl$_3$, will become increasingly important as a way of reducing hillocking and improving the electromigration lifetime of an interconnect. The structure of FIG. 1E may now undergo passivation which is the next step in the semiconductor fabrication process, if desired.

Figure 2A:
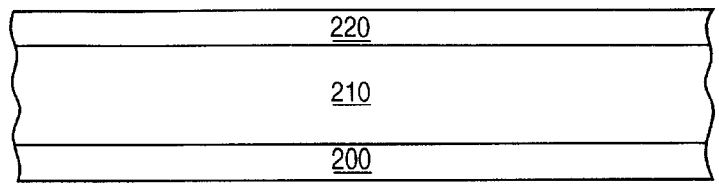
FIG. 2A illustrates the formation of three layers of a conductive structure in another embodiment of the present invention.
Figure 2B:
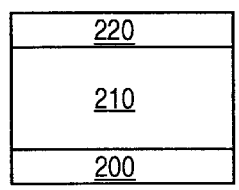
FIG. 2B shows a conductive structure that results from an etch of the three layers of FIG. 2A.

FIGS. 2A–2E illustrate another embodiment of the method of the present invention. As shown in FIG. 2A, a layer of titanium 200 of about 0.1 $\mu$m to 0.4 $\mu$m is sputtered deposited. Next, a layer of Al-0.5% Cu 210 with a thickness of about 0.3 $\mu$m to 1 $\mu$m is sputtered deposited. Finally, layer of titanium 220 with a thickness of about 0.1 $\mu$m to 0.4 $\mu$m is also sputtered deposited using conventional techniques. A dry etch of the three layers (200, 210 and 220) using conventional methods is utilized to form a conductive structure as illustrated in FIG. 2B. A third layer of titanium 230 is then sputtered deposited over the three previous layers of titanium and aluminum (200, 210, 220) using conventional means in FIG. 2C.

Figure 2C:
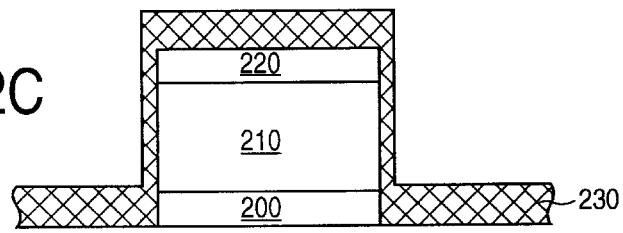
FIG. 2C illustrates formation of a fourth layer over the conductive structure.
Figure 2D:
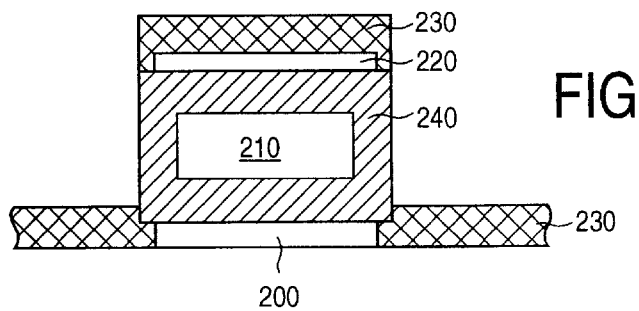
FIG. 2D illustrates formation of a cladding layer.
Figure 2E:
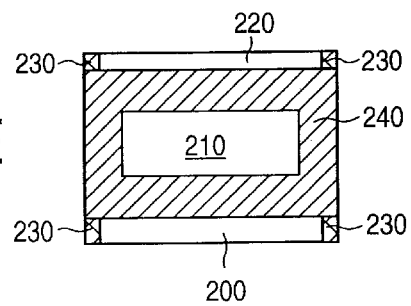
FIG. 2E illustrates an etch of unreacted portions of the fourth layer.

A portion of aluminum layer 210 reacts with titanium layer 200, titanium layer 220 and titanium layer 230 to form a TiAl$_3$ cladding layer 240, as shown in FIG. 2D. Heat, in the range of about 350° C.–450° C. is applied to accelerate the chemical reaction between the aluminum and titanium. The unreacted portion of aluminum layer 210 is now encapsulated by TiAl$_3$ cladding layer 240. In FIG. 2D, the reaction between the aluminum and titanium has been timed so that not all of titanium layer 200 and titanium layer 220 were consumed in the reaction with aluminum layer 210. However, the thickness of titanium layers (210, 220) could have been decreased so that all of the titanium layers (200, 220) would be consumed in the reaction with aluminum layer 210. TiAl$_3$ cladding layer 240 forms sidewalls around aluminum layer 210 which helps prevent sidewall hillocking. Finally, unreacted portions of titanium layer 230 are etched using conventional techniques, as illustrated in FIG. 2E. The structure shown in FIG. 2E is now available for passivation, if desired.

In another embodiment, the cladding layer may be formed of a material that does not react with an aluminum line (e.g., 110 of FIG. 1C or 210 of FIG. 2C). For example, a first layer of titanium or tantalum is formed and then a second layer of aluminum or an aluminum alloy with 0.1%–2.0% Cu is formed over the first layer. The two layers are then etched to form a conductive structure, such as an interconnect. A cladding layer made of titanium nitride (TiN), tungsten (W) and titanium tungsten (TiW) is then formed over the conductive structure. The cladding layer encapsulates the conductive structure and serves as a mechanical constraint to prevent electromigration induced hillocking. In addition, the cladding layer may be etched so that only the cladding layer around the sidewalls of the conductive structure remains.

According to yet another embodiment, a third conductive layer is formed over the first two layers of the previous embodiment. The third conductive layer comprises titanium or tantalum. The first, second and third layers are then etched to form a conductive structure. A cladding layer is then deposited over the conductive structure, wherein the cladding layer (e.g., TiN) does not react with any of the three conductive layers. The cladding layer encapsulates the conductive structure and provides a mechanical constraint. Moreover, the cladding layer may be removed from a top surface of the conductive structure so that the cladding layer supports the sidewalls of the conductive structure.

It is to be appreciated that the amount of copper added to the aluminum may vary from 0.1%–2.0%. In addition, silicon, in the range of 0–2.0% may also be added to the aluminum and copper as a process control since the silicon limits or inhibits TiAl$_3$ formation in this particular method. Furthermore, tantalum or any other intermetallic forming metal, such as tungsten or titanium tungsten, may be used instead of titanium in one embodiment, as tantalum reacts readily with aluminum to form a stiff intermetallic. In yet another embodiment, titanium may be used as layers 200 and 220 and tantalum may be used as layer 230. Moreover, each of the layers may be formed utilizing methods other than sputter deposition. In addition, the thicknesses of the various layers may vary depending on a particular application of the present invention. The same caveat is to be noted regarding the amount of heat applied and the length of time the heat is applied to the reaction between aluminum and titanium.

There are several advantages to the method of the present invention. First, the encapsulation of the interconnect using TiAl$_3$ increases electromigration lifetime, provides a constraint to hillocking and thus improves the performance of the interconnect. Second, the method uses the current toolset so no additional manufacturing costs will be incurred. Third, aluminum has a very good crystallographic texture on the titanium underlayers. Fourth, the titanium deposition after the first etch and clean will help to getter sidewall residues and eliminate electromigration void nucleation sites. Finally, since the reaction between titanium and aluminum occurs before a passivation step, no stress voids will be generated.

In the above description, numerous specific details were given to be illustrative and not limiting of the present invention. It will be apparent to one skilled in the art that the invention may be practiced without these specific details. Furthermore, specific semiconductor manufacturing equipment and processes have not been set forth in detail in order not to unnecessarily obscure the present invention. Thus, the method of the present invention is defined by the appended claims.

Thus, a method is described for cladding an interconnect for improved electromigration performance in a cost effective manner.

We claim:

1. A method for encapsulating an interconnect for improved electromigration performance, said method comprising:
    a) forming a first conductive layer;
    b) forming a second conductive layer that is disposed over said first conductive layer;
    c) etching said first and said second conductive layers to form a conductive structure; and
    d) forming a cladding layer over said conductive structure, wherein said cladding layer serves as a mechanical constraint to said conductive structure and
    e) reacting said cladding layer with at least one of the conductive layers.

2. The method of claim 1, wherein said first conductive layer is selected from a group consisting of titanium and tantalum.

3. The method of claim 2, wherein said second conductive layer is selected from a group consisting of aluminum and an aluminum alloy comprised of aluminum with copper.

4. The method of claim 3, wherein said cladding layer is selected from a group consisting of titanium nitride, tungsten and titanium tungsten.

5. The method of claim 1, further including the following step:
    etching said cladding layer so that cladding layer surrounds only the sidewalls of said conductive structure.

6. A method for encapsulating a conductive structure having a first layer, a second layer and a third layer, said method comprising:
    a) forming a cladding layer over said conductive structure;
    b) etching said cladding layer to remove a top surface of said cladding layer and leaving said cladding to support two sidewalls of said conductive structure; and
    c) reacting said cladding layer with at least the second layer.

7. The method of claim 6, wherein said first and said third layers are selected from a group consisting of titanium and tantalum.

8. The method of claim 7, wherein said second layer is selected from a group consisting of aluminum and an aluminum alloy of aluminum with copper.

9. The method of claim 8, wherein said cladding layer is selected from a group consisting of titanium nitride, tungsten and titanium tungsten.

10. A method of encapsulating a conductive structure having a first layer, a second layer over said first layer, and a third layer over said second layer, said method comprising:
    a) forming a fourth layer over said conductive structure, wherein said fourth layer touches two opposing sidewalls of said second layer; and
    b) reacting at least a portion of said first layer, said third layer and said fourth layer with a portion of said second layer to form a cladding layer that encapsulates an unreacted portion of said second layer.

11. The method of claim 10, wherein said reacting step also includes applying heat.

12. A method for encapsulating an interconnect for improved electromigration performance, comprising:
    a) forming a first conductive layer of a first material;
    b) forming a second conductive layer of a second material that is disposed over said first conductive layer, wherein said first material and said second material react to form a third material;
    c) forming a third conductive layer of said first material that is disposed over said second conductive layer;
    d) forming a fourth conductive layer comprised of a fourth material that does not react with said second material, wherein said fourth conductive layer is disposed over said third conductive layer;
    e) etching said first conductive layer, said second conductive layer, said third conductive layer and said fourth conductive layer to form a conductive structure;
    f) forming a fifth conductive layer that is disposed over said conductive structure, wherein said fifth conductive layer comprises a fifth material that reacts with said second material; and
    g) forming a cladding layer that encapsulates four sides of an unreacted portion of said second conductive layer, which is formed by reacting said first conductive layer, said third conductive layer and said fifth conductive layer with said second layer.

13. The method of claim 12, wherein said step of forming a cladding layer also includes applying heat.

14. The method of claim 12, further comprising the step of etching any unreacted portions of said fifth conductive layer.

15. The method of claim 12, wherein said first and fifth materials each comprise titanium.

16. The method of claim 12, wherein said first material is titanium and said fifth material is tantalum.

17. The method of claim 12, wherein said first material is tantalum and said fifth material is titanium.

18. The method of claim 12, wherein said first and fifth materials are tantalum.

19. The method of claim 15, wherein said second conductive layer is an aluminum alloy and said fourth conductive layer is titanium nitride.

20. The method of claim 16, wherein said second conductive layer is an aluminum alloy and said fourth conductive layer is titanium nitride.

21. The method of claim 17, wherein said second conductive layer is an aluminum alloy and said fourth conductive layer is titanium nitride.

22. The method of claim 19, wherein said second conductive layer is an aluminum alloy and said fourth conductive layer is titanium nitride.

23. The method of claim 19, wherein said cladding layer is an intermetallic that is more rigid than SiO$_2$.

24. The method of claim 19, wherein said cladding layer is an intermetallic that is more rigid than a passivation layer being used around said interconnect.

25. The method of claim 19, wherein said cladding layer is $TiAl_3$.

26. The method of claim 19, wherein said aluminum alloy is aluminum with copper.

27. The method of claim 19, wherein said aluminum alloy is aluminum with copper and silicon.

28. A method for encapsulating an interconnect for improved electromigration lifetime, comprising:
   a) forming a conductive barrier layer;
   b) forming a first conductive layer that is disposed over said conductive barrier layer;
   c) forming a second conductive layer that is disposed over said first conductive layer;
   d) etching said second conductive layer, said first conductive layer and said conductive barrier layer to form an interconnect;
   e) forming a third conductive layer over said interconnect so that said third conductive layer is covering two sidewalls of said first conductive layer and said conductive barrier layer; and
   f) forming a cladding layer by reacting said first conductive layer with said conductive barrier layer, said second conductive layer and said third conductive layer so that a portion of said first conductive layer, said conductive barrier layer, said second conductive layer and said third conductive layer are converted into said cladding layer, wherein said cladding layer encapsulates an unreacted portion of said first conductive layer.

29. The method as in claim 28, wherein said step of forming a cladding layer includes applying heat.

30. The method as in claim 28, further comprising the step of etching any unreacted portions of said third conductive layer.

31. The method as in claim 28, wherein said conductive barrier layer is selected from a group consisting of titanium, tantalum, titanium nitride, titanium tungsten and tungsten.

32. The method as in claim 31, wherein said first conductive layer is an aluminum alloy.

33. The method of claim 32, wherein said aluminum alloy is aluminum with copper.

34. The method as in claim 32, wherein said second conductive layer is selected from a group consisting of titanium, tantalum, titanium nitride, titanium tungsten and tungsten.

35. The method as in claim 34, wherein said third conductive layer is selected from a group consisting of titanium, tantalum, titanium nitride, titanium tungsten and tungsten.

36. The method as in claim 35, wherein said cladding layer is $TiAl_3$.

37. The method as in claim 28, wherein said conductive barrier layer, said second conductive layer and said third conductive layer are each composed of tantalum.

38. A method of encapsulating a conductive structure having a first layer, a second layer selected from the group consisting of aluminum and an aluminum alloy of aluminum with copper, and a third layer, said method comprising:
   a) forming a cladding layer over said conductive structure; and
   b) etching said cladding layer to remove a top surface of said cladding layer and leaving said cladding layer to support two sidewalls of said conductive structure.

* * * * *

UNITED STATES PATENT AND TRADEMARK OFFICE
CERTIFICATE OF CORRECTION

PATENT NO. : 5,909,635
DATED : June 1, 1999
INVENTOR(S) : Marieb et al.

It is certified that error appears in the above-identified patent and that said Letters Patent is hereby corrected as shown below:

Column 2,
Line 11, delete "ground" and insert -- found --.

Column 3,
Line 31, immediately after "3Al", insert -- +Ti --.

Signed and Sealed this

Sixth Day of April, 2004

JON W. DUDAS
*Acting Director of the United States Patent and Trademark Office*